United States Patent
Zheltov et al.

(10) Patent No.: US 7,205,915 B2
(45) Date of Patent: Apr. 17, 2007

(54) METHOD OF DECODING VARIABLE LENGTH PREFIX CODES

(75) Inventors: Sergey Nikolaevich Zheltov, Nizhny Novgorod (RU); Stanislav Viktorovich Bratanov, Nizhny Novgorod (RU)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/564,678

(22) PCT Filed: Jul. 15, 2003

(86) PCT No.: PCT/RU03/00307

§ 371 (c)(1),
(2), (4) Date: Apr. 18, 2006

(87) PCT Pub. No.: WO2005/006562

PCT Pub. Date: Jan. 20, 2005

(65) Prior Publication Data

US 2006/0187096 A1    Aug. 24, 2006

(51) Int. Cl.
*H03M 7/40* (2006.01)
(52) U.S. Cl. .................... 341/67; 341/65; 341/106; 382/246
(58) Field of Classification Search ............. 341/65, 341/67, 106; 382/246
See application file for complete search history.

(56) References Cited

U.S. PATENT DOCUMENTS

| 4,475,174 | A | | 10/1984 | Kanayama | |
|---|---|---|---|---|---|
| 4,899,149 | A | * | 2/1990 | Kahan | 341/67 |
| 5,559,831 | A | | 9/1996 | Keith | |
| 5,589,829 | A | * | 12/1996 | Astle | 341/67 |
| 6,008,745 | A | * | 12/1999 | Zandi et al. | 341/67 |
| 6,147,629 | A | * | 11/2000 | Wood | 341/67 |
| 6,219,457 | B1 | | 4/2001 | Potu | |
| 6,587,057 | B2 | * | 7/2003 | Scheuermann | 341/67 |
| 6,891,976 | B2 | * | 5/2005 | Zheltov et al. | 382/246 |

\* cited by examiner

*Primary Examiner*—Khai M. Nguyen
(74) *Attorney, Agent, or Firm*—Sanjay S. Gadkari

(57) ABSTRACT

The method disclosed may be used together with any prefix oriented decoding method to enable faster decoding of variable length codes when a subset of most frequently used codes with relatively short prefixes may be determined. An embodiment of the present invention reads a number of bits, not less than the maximal possible length of a code, from a bit stream. Then a predetermined number of bits is selected and used as an index to a data structure that contains at least a decoded value and a validity indicator, along with other pre-decoded data, namely: prefix type and length, maximal code length for a group of codes, actual code length, the number of bits to return to the bit stream, etc. The validity indicator is used to determine whether to proceed with the decoding operation, or obtain the valid decoded value from the data structure and return excess bits to the bit stream. If the decoded value is indicated to be invalid, the decoding operation is continued, and a decoding method that estimates the length of the code prefix and the number of significant bits corresponding to the length estimated is applied to the bits initially read from the bit stream.

21 Claims, 3 Drawing Sheets

METHOD OF DECODING VARIABLE LENGTH PREFIX CODES

CROSS-REFERENCE TO RELATED APPLICATION

This application is a National Phase application of, and claims priority to, International Application No. PCT/RU2003/000307, filed Jul. 15, 2003, entitled A METHOD OF DECODING VARIABLE LENGTH PREFIX CODES.

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field

The present invention relates generally to decoding of variable-length prefix codes, e.g., Huffman codes, and, more specifically, to a new, combined decoding scheme of lookup table decoding and prefix oriented decoding.

2. Description

Entropy coding is a widely used data compression technique that many video and audio coding standards are based on. The theoretical basis of entropy coding states that a compression effect can be reached when the most frequently used data are coded with a fewer number of bits than the number of bits denoting the less frequently appearing data. This approach results in coded data streams composed of codes having different lengths.

There are a number of methods to form such variable length codes (VLC). One popular method uses a prefixed coding in which a code consists of a prefix that allows a decoding system to distinguish between different codes, and several significant bits representing a particular value (e.g., Huffman coding).

While most coding standards employ Huffman codes with prefixes composed of a series of '1' or '0' bits in their coding schemes, some standards (e.g., ISO/IEC 14496-2, Moving Pictures Experts Group (MPEG)-4 coding standard, Visual) allow for different coding schemes prefixed with a series of longer bit patterns.

As a general rule, the number of bits that comprise a variable length code depends on the number of bits that comprise the prefix of the code. At the same time, an experimentally defined subset of most frequently appearing codes may have relatively short prefixes (including zero prefix) and, thus, may be decoded in a lookup manner as a single code, which may be a faster way of decoding for a particular system.

Therefore, a need exists for the capability to provide high speed decoding of variable length codes prefixed with regular combinations of bits, in accordance with the actual frequency-to-code length distribution.

BRIEF DESCRIPTION OF THE DRAWINGS

The features and advantages of the present invention will become apparent from the following detailed description of the present invention in which.

DETAILED DESCRIPTION

An embodiment of the present invention is a method of implementing a decoder for variable length codes that have prefixes composed of regular bit patterns. To apply the disclosed method to a particular coding scheme, such a scheme should comprise a subset of most frequently used codes with relatively short prefixes (including zero prefix), such that the prefix scan operation becomes inefficient. According to the disclosed method, the number of bits, not less than the maximal possible length of a VLC, is read from a bit stream. Then a predetermined number of bits is selected and used as an index to a data structure that contains at least a decoded value and validity indicator, along with other pre-decoded data, including but not limited to: prefix type and length, maximal code length for a group of codes, actual code length, and the number of bits to return to the bit stream. The validity indicator is used to determine whether to proceed with the decoding operation, or obtain the valid decoded value from the data structure and return excess bits to the bit stream. If the decoded value is indicated to be invalid, the decoding operation is continued, and a decoding method that estimates the length of the code prefix and the number of significant bits corresponding to the length estimated is applied to the bits initially read from the bit stream. The disclosed method requires less memory than direct lookup decoding methods, and performance of the method exhibits less memory access overhead as compared to prior art methods using multiple lookup tables. Additionally, the present method appears to be more efficient for decoding of 'short prefix' codes as compared to other prefix oriented methods because it excludes operations of prefix type and length determination for the most frequently used codes.

Reference in the specification to "one embodiment" or "an embodiment" of the present invention means that a particular feature, structure or characteristic described in connection with the embodiment is included in at least one embodiment of the present invention. Thus, the appearances of the phrase "in one embodiment" appearing in various places throughout the specification are not necessarily all referring to the same embodiment.

Figure 1:
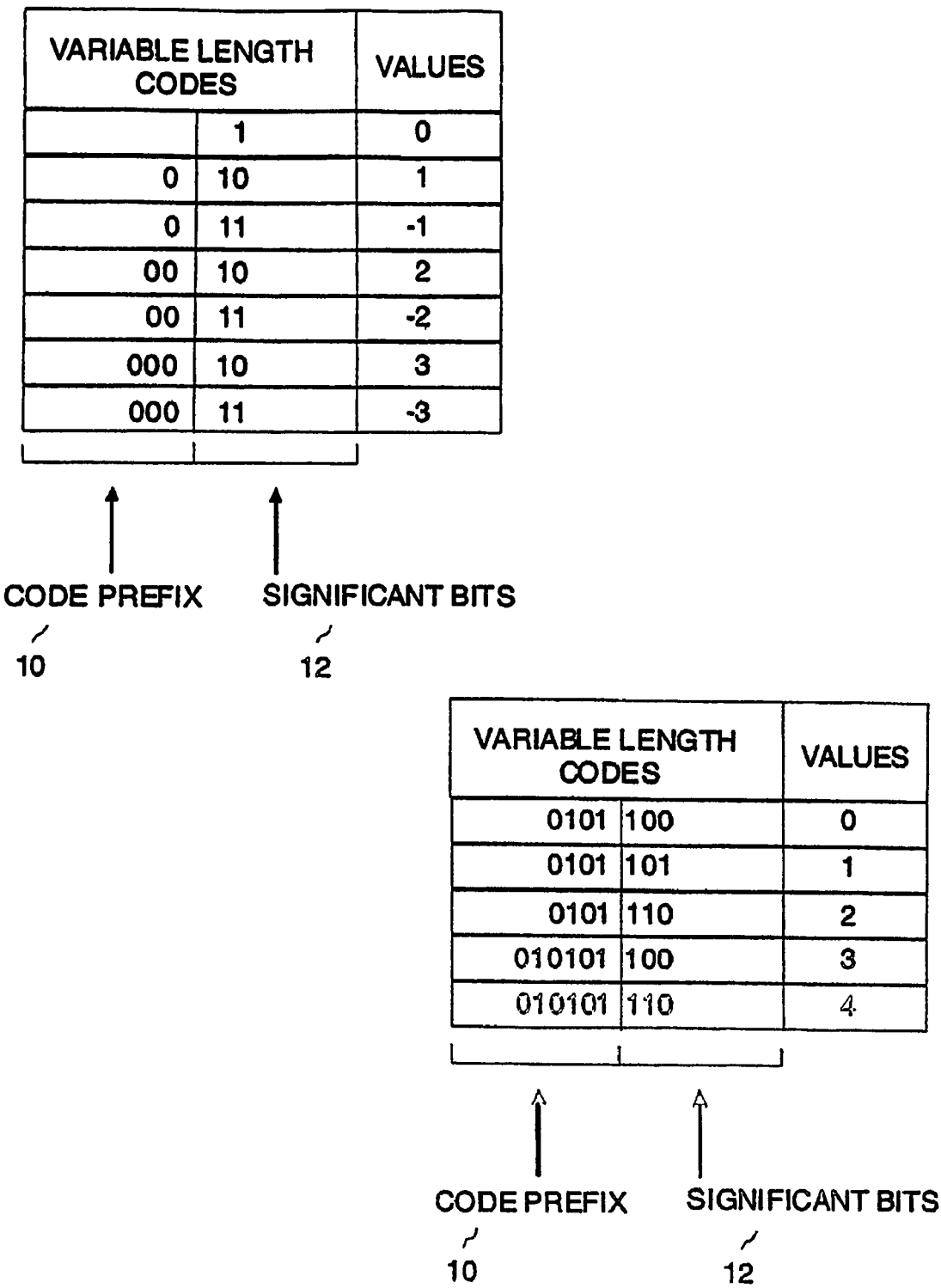
FIG. 1 is a diagram illustrating an exemplary variable length coding.

FIG. 1 is a diagram illustrating an exemplary variable length coding. As depicted by FIG. 1, each variable length code has a group of bits used as a prefix 10 and a group of significant bits 12. The prefixes may be composed of a group of bits (bit patterns) that (in a general case) are replicated and concatenated to each other. The bits that follow the code prefix may be called significant bits.

Variable length codes (VLCs) may have identical prefixes. In this case, the codes constitute a prefix code group, but at the same time the number of significant bits that follow the prefix may differ. The maximal number of significant bits that is possible for a code in such a group may be referred to as the maximal bit number. The number of bits that follow the prefix for each VLC may be called the actual bit number.

Figure 2:
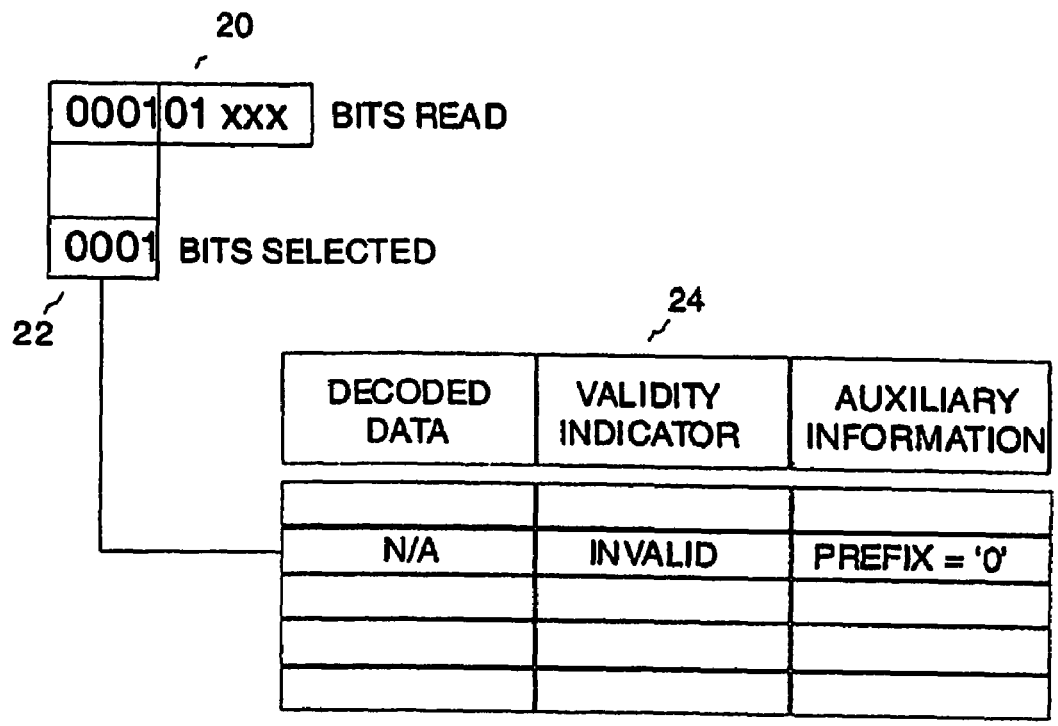
FIG. 2 is a diagram illustrating relations between bits initially read from a bit stream, selected bits, and a table containing a decoded value, a validity indicator, and auxiliary information.
Figure 2:
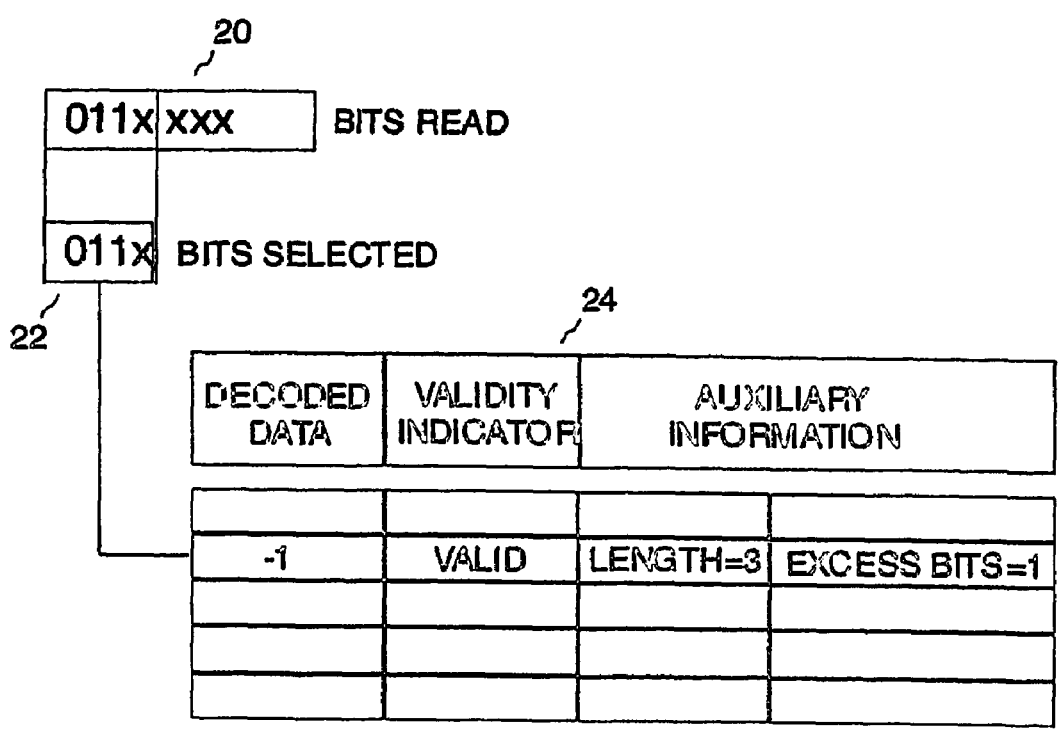

FIG. 2 is a diagram illustrating relations between bits initially read from a bit stream, selected bits, and a table containing a decoded value, a validity indicator and auxiliary information in accordance with an embodiment of the present invention. As depicted in the example of FIG. 2, the number of bits 20 not less than any possible VLC length, i.e., the number of bits enough to contain the longest VLC in a particular coding scheme, may be read from a bit stream. Any number of leading bits 22 may be selected from the bits read. A data structure 24 is provided to contain at least decoded data and a validity indicator for each bit combination that may be formed from the selected bits. The data structure 24 may also contain auxiliary information on the type of prefix, code length, and the number of bits to return to the bit stream, in order to facilitate future decoding.

Figure 3:
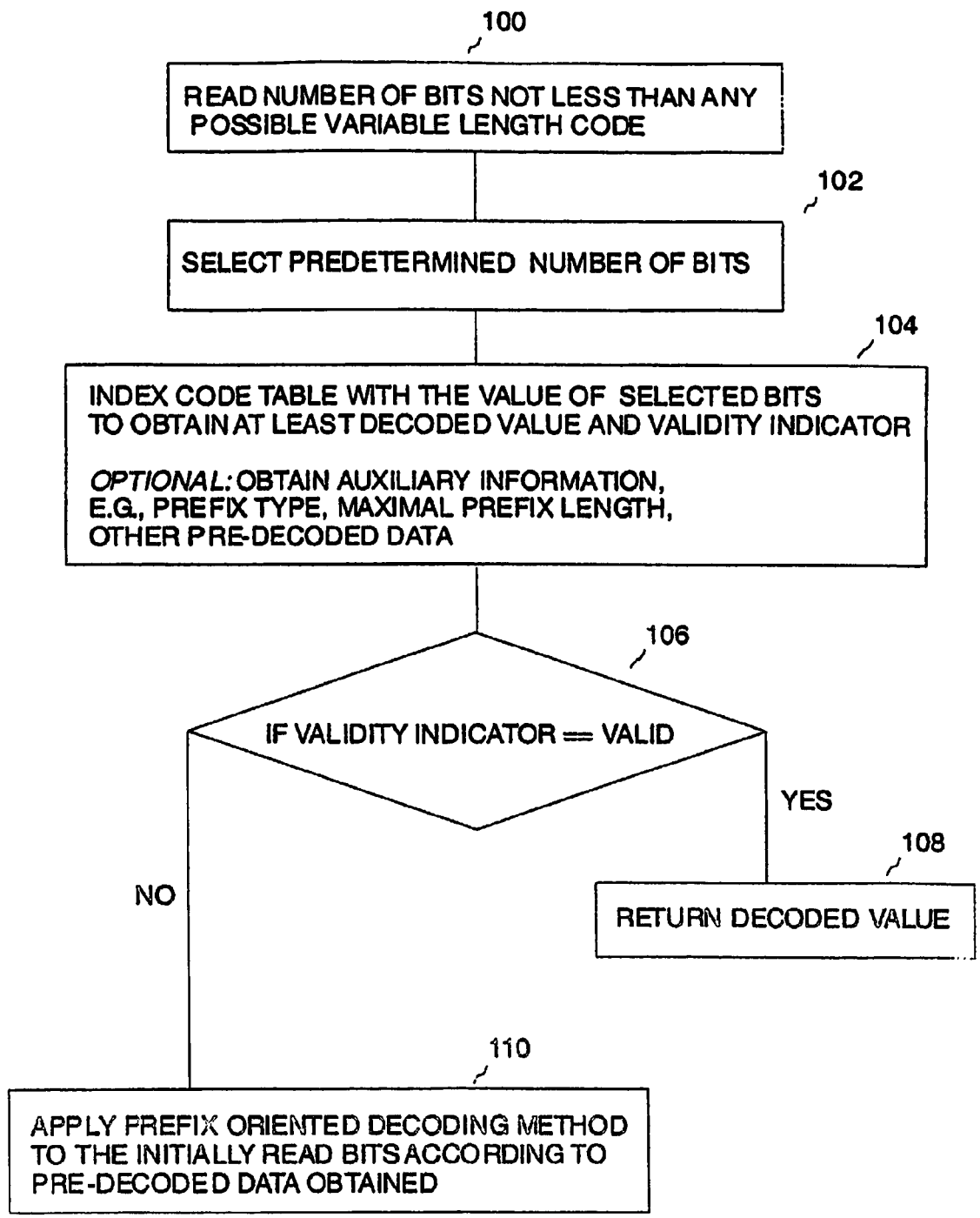
FIG. 3 is a flow diagram illustrating the variable length decoding process in accordance with an embodiment of the present invention.

FIG. 3 is a flow diagram illustrating a variable length decoding process in accordance with an embodiment of the present invention. At block 100, the number of bits not less than any possible variable length code is read from a bit stream. The number of bits read should be sufficient to contain the longest variable length code but is not limited to store extra bits as it may facilitate the decoding process (e.g., the bits read fit the machine word size). Then, at block 102, the predetermined number of bits may be selected from the bits previously read. The number of bits to select depends on a particular coding scheme used, and, therefore, is determined by external means. The determination should be performed in a manner that allows the selected bits to span the most frequently used (the most probable) VLCs and at the same time to minimize the size of a code lookup table. At block 104 the code lookup table is indexed with the value formed from the selected bits, and at least a decoded value and a validity indicator, as well as auxiliary information are obtained. In one embodiment, obtaining the auxiliary information may be optional. The validity indicator is then checked at block 106, and if it is indicated to be valid, the decoded value obtained at block 104 is returned as the result of the decoding process at block 108. If necessary, the actual code length or the difference between the actual length and the number of selected bits (retrieved as auxiliary information at block 104) may be checked in order to adjust the bit stream after decoding.

If the decoded data is indicated to be invalid, a prefix oriented decoding method (i.e., a method that estimates the length of the code prefix and the number of significant bits corresponding to the length estimated) is applied at block 110 to the bits initially read from the bit stream. The auxiliary information obtained at block 104 may describe the type and length of the code prefix, and thus, increase the performance of the method to be further applied.

For an exemplary embodiment of the present invention implemented in the C and Assembler programming languages, refer to Appendix A. This example is non-limiting and one skilled in the art may implement the present invention in other programming languages without departing from the scope of the claimed invention.

The techniques described herein are not limited to any particular hardware or software configuration; they may find applicability in any computing or processing environment. The techniques may be implemented in logic embodied in hardware, software, or firmware components, or a combination of the above. The techniques may be implemented in programs executing on programmable machines such as mobile or stationary computers, personal digital assistants, set top boxes, cellular telephones and pagers, and other electronic devices, that each include a processor, a storage medium readable by the processor (including volatile and non-volatile memory and/or storage elements), at least one input device, and one or more output devices. Program code is applied to the data entered using the input device to perform the functions described and to generate output information. The output information may be applied to one or more output devices. One of ordinary skill in the art may appreciate that the invention can be practiced with various computer system configurations, including multiprocessor systems, minicomputers, mainframe computers, and the like. The invention can also be practiced in distributed computing environments where tasks may be performed by remote processing devices that are linked through a communications network.

Each program may be implemented in a high level procedural or object oriented programming language to communicate with a processing system. However, programs may be implemented in assembly or machine language, if desired. In any case, the language may be compiled or interpreted.

Program instructions may be used to cause a general-purpose or special-purpose processing system that is programmed with the instructions to perform the operations described herein. Alternatively, the operations may be performed by specific hardware components that contain hard-wired logic for performing the operations, or by any combination of programmed computer components and custom hardware components. The methods described herein may be provided as a computer program product that may include a machine readable medium having stored thereon instructions that may be used to program a processing system or other electronic device to perform the methods. The term "machine readable medium" used herein shall include any medium that is capable of storing or encoding a sequence of instructions for execution by the machine and that cause the machine to perform any one of the methods described herein. The term "machine readable medium" shall accordingly include, but not be limited to, solid-state memories, optical and magnetic disks, and a carrier wave that encodes a data signal. Furthermore, it is common in the art to speak of software, in one form or another (e.g., program, procedure, process, application, module, logic, and so on) as taking an action or causing a result. Such expressions are merely a shorthand way of stating the execution of the software by a processing system cause the processor to perform an action or produce a result.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. In a system for decoding variable length prefix codes in a bit stream, a method comprising:
   reading, from the bit stream, a number of bits sufficient to store a longest variable length code of the system;
   selecting a predetermined number of bits from the bits read;
   obtaining, from a data structure, in accordance with an actual value of the bits selected, at least a decoded value and a validity indicator associated with a variable length code; and
   applying a prefix oriented decoding method to the bits initially read from the bit stream when the decoded value is indicated to be invalid.

2. The method of claim 1, wherein reading the number of bits comprises making the specified number of bits accessible for future operations.

3. The method of claim 1, wherein selecting the number of bits comprises making the specified number of bits accessible for future operations, faster than reading the same number of bits.

4. The method of claim 1, wherein the predetermined number of bits comprises the maximal number of bits to be used as an index to the data structure.

5. The method of claim 1, wherein the validity indicator indicates whether the decoded value is valid.

6. The method of claim 1, wherein the data structure used to obtain at least the decoded value and validity indicator associated with a variable length code comprises a memory area containing at least the decoded value and validity indicator for each bit combination that can be formed from the predetermined number of bits.

7. The method of claim 1, wherein the prefix oriented decoding method further comprises a method of variable length decoding that employs variable length code prefix properties during decoding.

8. An article comprising: a machine accessible medium having a plurality of machine readable instructions, wherein when the instructions are executed by a processor, the instructions provide for decoding of variable length prefix codes in a bit stream by
   reading, from the bit stream, a number of bits sufficient to store a longest variable length code of the system;
   selecting a predetermined number of bits from the bits read;
   obtaining, from a data structure, in accordance with an actual value of the bits selected, at least a decoded value and validity indicator associated with a variable length code; and
   applying a prefix oriented decoding method to the bits initially read from the bit stream when the decoded value is indicated to be invalid.

9. The article of claim 8, wherein instructions for reading the number of bits comprise instructions for making the specified number of bits accessible for future operations.

10. The article of claim 8, wherein instructions for selecting the number of bits comprise instructions for making the specified number of bits accessible for future operations, faster than reading the same number of bits.

11. The article of claim 8, wherein the predetermined number of bits comprises the maximal number of bits to be used as an index to the data structure.

12. The article of claim 8, wherein the validity indicator indicates whether the decoded value is valid.

13. The article of claim 8, wherein the data structure used to obtain at least the decoded value and validity indicator associated with a variable length code comprises a memory area containing at least the decoded value and validity indicator for each bit combination that can be formed from the predetermined number of bits.

14. The article of claim 8 wherein prefix oriented decoding method further comprises a method of variable length decoding that employs variable length code prefix properties during decoding.

15. A system for decoding variable length prefix codes in a bit stream, comprising:
   logic to read from the bit stream a number of bits sufficient to store a longest variable length code of the system;
   logic to select a predetermined number of bits from the bits read;
   logic to obtain from a data structure, in accordance with the actual value of the bits selected, at least a decoded value and a validity indicator associated with a variable length code; and
   logic to apply a prefix oriented decoding method to the bits initially read from the bit stream when the decoded value is indicated to be invalid.

16. The system of claim 15, wherein logic to read the number of bits comprises logic to make the specified number of bits accessible for future operations.

17. The system of claim 15, wherein logic to select the number of bits comprises logic to make the specified number of bits accessible for future operations, faster than logic to read the same number of bits.

18. The system of claim 15, wherein the predetermined number of bits comprises the maximal number of bits to be used as an index to the data structure.

19. The system of claim 15, wherein the validity indicator indicates whether the decoded value is valid.

20. The system of claim 15, wherein the data structure used to obtain at least the decoded value and validity indicator associated with a variable length code comprises a memory area containing at least the decoded value and validity indicator for each bit combination that can be formed from the predetermined number of bits.

21. The system of claim 15 wherein prefix oriented decoding method further comprises a method of variable length decoding that employs variable length code prefix properties during decoding.

* * * * *